United States Patent [19]

Wendman

[11] Patent Number: 4,882,023
[45] Date of Patent: Nov. 21, 1989

[54] METHOD AND SYSTEM FOR PRODUCING THIN FILMS

[75] Inventor: Mark Wendman, Austin, Tex.

[73] Assignee: Motorola, Inc., Schaumburg, Ill.

[21] Appl. No.: 168,055

[22] Filed: Mar. 14, 1988

[51] Int. Cl.⁴ .............................................. C23C 14/00
[52] U.S. Cl. .......................... 204/192.31; 204/192.24;
204/298; 427/38; 118/723
[58] Field of Search ...................... 204/192.11, 192.15,
204/192.24, 298, 192.31; 427/35, 38, 42, 45.1,
46; 118/723

[56] References Cited

U.S. PATENT DOCUMENTS

| | | | |
|---|---|---|---|
| 4,147,573 | 4/1979 | Morimoto | 204/192.31 X |
| 4,152,478 | 5/1979 | Takagi | 204/192.31 X |
| 4,522,674 | 6/1985 | Ninsmiya et al. | 118/723 |
| 4,559,901 | 12/1985 | Morimoto et al. | 427/38 X |
| 4,624,859 | 11/1986 | Akira et al. | 427/38 |
| 4,683,838 | 8/1987 | Kimura et al. | 118/723 X |
| 4,732,761 | 3/1988 | Machida et al. | 427/38 X |

OTHER PUBLICATIONS

Yamanishi et al., "High-Temperature . . . Beam Method", Material Res. Soc. Sym. Pro., vol. 99, 11/1987.

Primary Examiner—Nam X. Nguyen
Attorney, Agent, or Firm—John A. Fisher

[57] ABSTRACT

A method for forming multiple-component thin films using a separate ion cluster beam (ICB) source for each component. Stoichiometry control is provided by measuring the extraction currents across an acceleration voltage and controlling the component supply to the ICB source. The ion clusters are broken up into an atomic beam by microwave energy. If superconducting films are made, the atomic beams are passed through an oxygen plasma also generated by microwave energy to maximize oxygen incorporation into the thin film. The oxygenated atomic metal ion beams are focused onto a common substrate to form the multiple component thin film. Oxygen is kept away from the ICB sources by differential pumping seals.

4 Claims, 2 Drawing Sheets

METHOD AND SYSTEM FOR PRODUCING THIN FILMS

FIELD OF THE INVENTION

The invention relates to producing thin films of materials on substrates, and more particularly relates to producing thin films employing beams of particles.

BACKGROUND OF THE INVENTION

With many types of film formation processes, it is not a problem to produce the films with the components in the desired proportions, for example in the formation of silicon dioxide or silicon nitride in silicon-based integrated circuits. However, in much of this conventional process technology, some variation in the exact stoichiometric proportions is tolerable without adversely affecting the performance of the resulting integrated circuits.

The task of forming thin films, such as those used in integrated circuits and other applications, is made more difficult when the film is formed of a multiplicity of components, for example, more than two. Such thin film formation processes have particular problems in the fabrication of superconducting material films and other types of films requiring exact stoichiometric proportions, as might be applied to integrated circuits, printed circuit boards, interconnect structures and other substrates. For example, a major difficulty experienced in the fabrication of the recently discovered superconducting ceramic compound $YBa_2Cu_3O_7$ is adequate oxygen incorporation into the film during deposition or formation.

Another problem is that sufficient oxygen does not always remain a constituent of the film if the ceramic thin film is subsequently improperly annealed after formation. Annealing has been found to sometimes reduce oxygen content. Nevertheless, in some processes, annealing is required to form orthorhombic crystal structures needed for high critical temperatures, $T_c$, that is, the temperature below which the superconducting characteristic is observed.

Many different types of techniques for the production of the older, lower $T_c$ superconducting films are known. For example, processes for electrodeposition of materials on a substrate using liquid electrolytes for forming superconducting films at low temperatures, called "cryoelectrodeposition", are known. Anodizing thin superconducting films to improve their properties is also known.

Another known technique for forming layered, multiconstituent films involves a low temperature method using at least two ballistic particle streams that are caused to intersect in a volume of space proximate to the substrate. One particle stream, the "gas" stream, comprises excited neutral particles, and the other particle stream, the "metal" stream, consists substantially of a particle species capable of chemically reacting with the excited neutrals. The excited neutrals are typically produced in a RF-generated plasma or by means of photon excitation, while the source of the metal stream is typically an evaporator.

One method for avoiding interlayer contamination of superconducting structures, which can degrade the quality of the devices, is to deposit two or more layers within an ultra-high vacuum (UHV) chamber without breaking vacuum between depositions. The depositions themselves present relatively few difficulties since independently controlled multiple evaporators or sputtering sources can be provided inside the UHV chamber. However, these techniques are not helpful in producing multi-component films homogeneously since they tend to form separate layers of elements, rather than one layer of the correct, mixed stoichiometric proportion.

The sputtering of a ceramic target of an oxide superconducting material, such as $BaPb_{1-x}Bi_x$-$O_3(0.05 \leq x \leq 0.3)$, for example, for forming superconducting electrodes is further known.

A surface reaction process for controlled oxide growth is also known which uses a directed, low energy ion beam for compound or oxide formation. In contrast with RF oxidized junctions, such ion beam oxidized junctions contain less contamination by back sputtering, and the quantitative nature of ion beam techniques allows greater control over the growth process.

In the production of the new, high $T_c$ ceramic superconducting films, many workers who have demonstrated superconducting thin films have used electron beam co-evaporation in a vacuum into which oxygen was introduced at as high a pressure as tolerable by the evaporator's vacuum system. This technique is marginal with respect to incorporating enough oxygen into the deposited thin films for a number of reasons. First, the evaporation produces "droplets" or clusters of the metals, for example yttrium, barium and copper, and limits the bonding of interior atoms to the oxygen in the vacuum. Secondly, it is difficult to produce films of repeatable stoichiometry using co-evaporation from multiple, separate hearths; for example, three hearths if yttrium, and copper are used. Other elements useful in the production of superconducting films include lanthanum, niobium, lead, strontium, aluminum, thallium, barium and mixtures thereof, among others.

Chemical vapor deposition (CVD) is impractical for forming these types of superconducting thin films since copper does not readily form volatile species. The use of organo metallic chemical vapor deposition (OMCVD) has recently been applied to superconducting materials, but only resulted in making low critical current superconducting films. The critical current, $I_c$, is the current above which the superconducting state ceases.

RF sputtering from a composite target does not afford process flexibility for tuning the superconducting film characteristics. Only films with low critical currents have been produced this way.

It has also been found that the as-deposited film characteristics are highly dependent upon the reactor configuration. Single pass, multi-target, or even several-pass multiple target reactors, such as those used by MRC and Hypres, are of limited use inasmuch as only structures of multiple or alternating layers of discrete components may be formed, rather than homogeneous crystalline compounds.

Epitaxial regrowth techniques, such as those employed by IBM with respect to strontium titanate substrates have provided results at great expense. Ion cluster beam (ICB) deposition systems are known, but do not include the process and equipment modifications discovered in conjunction with the present invention.

SUMMARY OF THE INVENTION

Accordingly, it is an object of the present invention to provide a method for forming thin films of a desired, precise multiple-component composition on a substrate.

Another object of the present invention is to provide a method for incorporating a high and sufficient proportion of a particular component, for example, oxygen, into the thin film being formed.

It is another object of the present invention to provide a method for repeatedly and precisely providing superconducting thin films of an exact stoichiometric composition.

In carrying out these and other objects of the invention, there is provided, in one form, a method for forming multiple-component thin films on a substrate that first involves, for each of at least two of the components of a thin film, generating a separate ion-cluster beam by vaporization of the component in an isolated, heated crucible, where the crucible has a beam exit nozzle and a source controller for regulating the quantity of the component leaving the crucible. Next, the ion-cluster beam is directed toward the substrate by accelerating the beam through an accelerating voltage with an extraction current spaced from the exit nozzle. Additionally, the extraction current of the component is monitored and information is fed back to the source controller to increase or decrease the supply of the components to maintain the quantities of ion-clusters distributed by the beam to the substrate within a predetermined stoichiometric proportion.

DETAILED DESCRIPTION OF THE INVENTION

Figure 1:
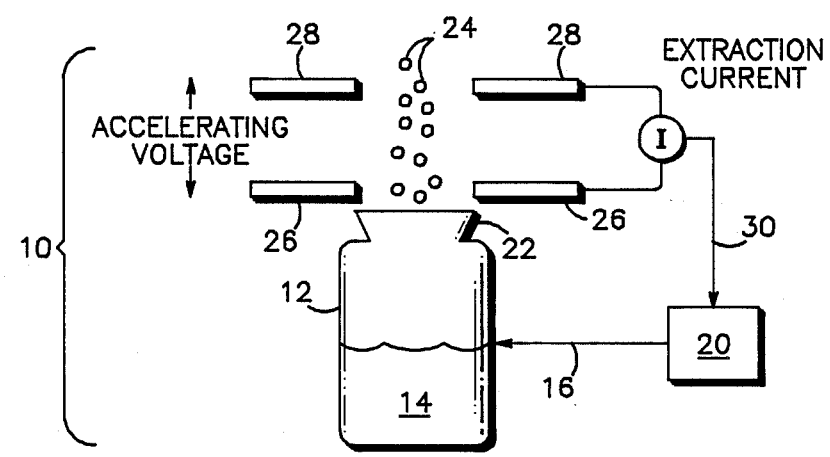
FIG. 1 is a schematic illustration of an ion cluster beam showing the extraction current measurement feedback loop to the source controller.

Ion cluster beams (ICB) deposition improves upon electron beam co-evaporation in a vacuum by accelerating the droplets to the substrate, but still provides the ions in "droplet" form. Shown in FIG. 1 is a schematic illustration of an ICB system 10 having a heated vaporizer crucible 12 with supply of component 14, such as a metal, the dispensation of which is regulated by a source controller 20. A beam exit nozzle 22 is provided for the exiting "droplets" 24.

"Droplets" or ion clusters 24 are accelerated out of exit nozzle 22 by means of spaced apart plates 26 and 28 across which an accelerating voltage is applied. The individual extraction currents across plates 26 and 28 can be masured and used for stoichiometric monitoring which is far more precise than evaporative, epitaxial monitors. The extraction current is measured on the high voltage supply output current using an ammeter, and is fed back to the source controller via path 30 to increase or decrease the supply of the component 14 to crucible 12 via supply line 16. Thus, the exact stoichiometric proportions can be maintained for the desired films. Such exact proportions are necessary in the case of superconducting films for the superconducting characteristic to be present.

ICB affords high and adjustable species mobility for deposition processes, providing flexibility in as-deposited film structures. This kind of control is essential in providing precise, stoichiometric proportions of the elements of multiple component films, such as superconducting films.

Figure 2:
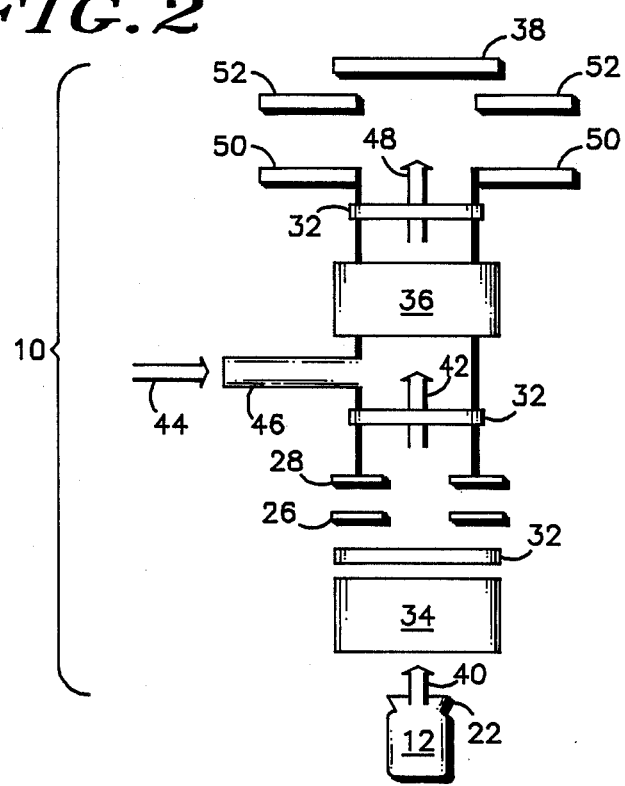
FIG. 2 is a schematic illustration of one of the ion beam sources showing how the microwave cavities are implemented.

In the event ceramic superconducting thin films are being made, oxygen incorporation will be desired. ICBs will likely have source difficulties in an oxygen ambient, probably through the clogging of the nozzle 22. However, the crucible 12 can be isolated from the deposition ambient, for example, $10^{-3}$ to $10^{-6}$ oxygen vacuum, through a series of differentially pumped seals 32 as shown in FIG. 2, by which clogging of the nozzle 22 can be reduced.

As mentioned, the metal ions tend to form clusters or droplets 24. This organization of the ions tends to make them less reactive with other oxygen, metals or other components. Shown in FIG. 2 is the additional use of microwave coupled plasma cavities 34 and 36 to break up the clusters into atomic ions, with the goal of permitting enhanced atomic metal oxidation prior to contact with the substrate 38. Passing the cluster beam 40 through a low pressure microwave plasma generated in cavity 34 will crack the clusters 24 into an atomic metal beam 42.

Film incorporation of oxygen requires millitorr or greater oxygen ambient surrounding substrates 38 during the deposition. This is a problem for many of the deposition techniques discussed earlier. By passing the atomic metal beam 42 through an oxygen plasma generated in microwave cavity 36 using oxygen input 44 at supply 46, an oxygenated atomic metal beam 48 can be produced prior to the final acceleration between plates 50 and 52 to enhance oxygen incorporation into the film.

This source system permits a deposition process of low vapor pressure materials which do not readily go into gas phase to be deposited in a semi-plasma mode. The native metals can be "atomized" from a high flux plasma source, oxygenated and accelerated toward the substrate 38 for thin film deposition. The extraction currents can be used for real-time stoichiometry control which provides a distinct advantage over co-evaporation.

Figure 3:
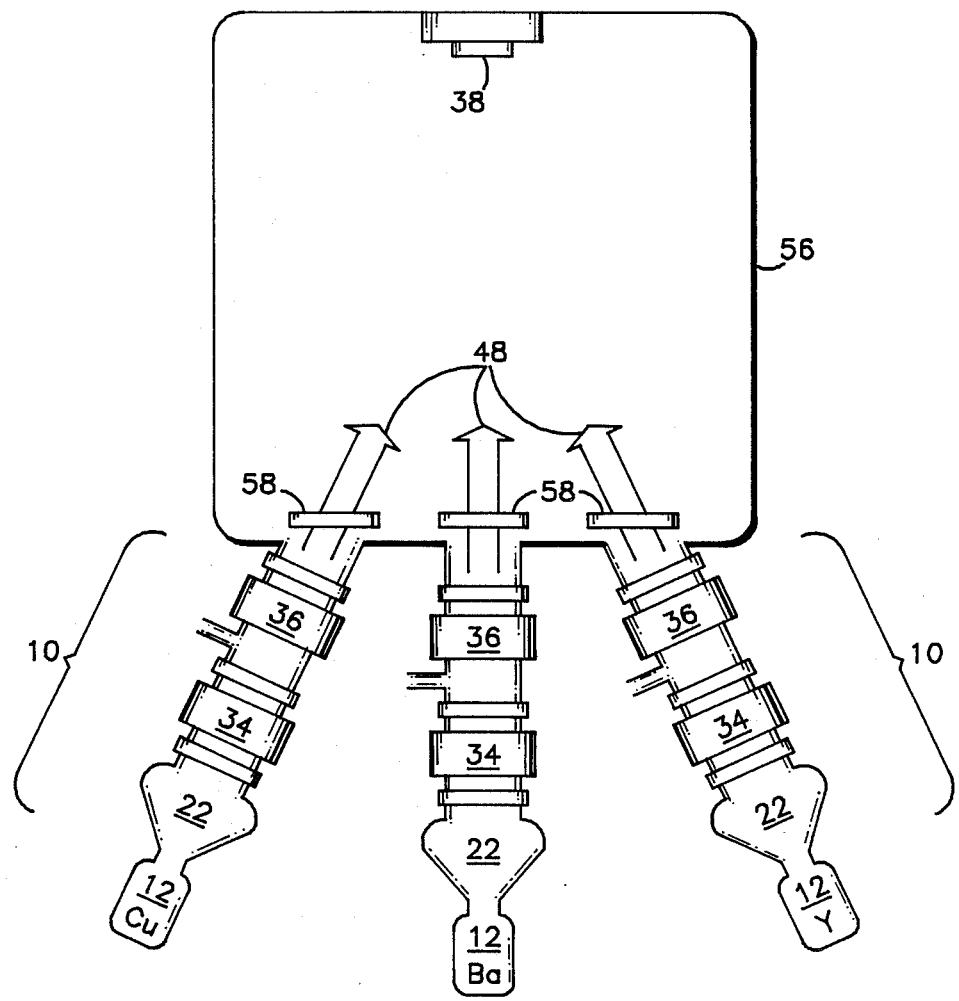
FIG. 3 is a schematic illustration of how three ion beam sources may be grouped to provide a controlled, superconducting film on a substrate.

Shownin FIG. 3 is a schematic illustration of the overall multiple-component, thin film deposition system 54 such as might be used for the formation of a conducting or dielectric film, for example, a superconducting ceramic film of $YBa_2Cu_3O_x$, where $6.5 < x \leq 7.0$. Three separate component source ICB systems 10 are shown, one for copper, one for barium and one for yttrium. Other component sources may be used, of course, and the invention is not limited to this group. The same reference numbers that were used in FIGS. 1 and 2 are employed herein for convenience. All three ICB systems 10 are aimed at common substrate 38 in reaction chamber 56. The respective oxygenated atomic metal beams 48 are permitted to enter chamber 56 via shutters 58 to combine, react and deposit the film upon the substrate in the correct stoichiometric amounts.

Besides improved stoichiometry control, this sytem may provide higher oxygen incorporation without annealing of the film after it is formed. Such post-film annealing can decrease the oxygen content as well as the uniformity of superconducting films. Prior film formation techniques employ annealing which tends to produce films with isolated regions having superconducting characteristics where the surrounding, oxygen depleted regions are semiconducting or non-conducting.

I claim:

1. A method for forming multiple-component thin films on a substrate comprising the steps of:
   for each of at least two of the components of a thin film:
   generating a separate ion-cluster beam by separate vaporization of the components in an isolated, heated crucible, the crucible having a beam exit nozzle and a source controller for regulating the quantity of the component leaving the crucible;
   directing the ion-cluster beam toward the substrate by accelerating the beam through an accelerating voltage;
   measuring an extraction current across the accelerating voltage to obtain a real time signal for monitoring the stoichiometry of the film;
   feeding back the real time signal to the source controller to increase or decrease the supply of the component to maintain the quantity of ionclusters distributed by the beam to the substrate within a predetermined stoichiometric proportion;
   fracturing the ion-cluster beam into an atomic ion beam with microwave energy after the ion-cluster beam leaves the crucible;
   generating an oxygen plasma with microwave energy, the oxygen plasma being confined in an isolated oxygenating chamber separated from a deposition chamber with differential pumping seals; and
   passing the atomic ion beam through the oxygen plasma in the isolated oxygenating chamber to incorporate oxygen into the atomic ion beam.

2. The method of claim 1 wherein the multiple-component thin film is a superconducting material and at least two of the components being vaporized in the isolated heated crucible are components selected from a group consisting of yttrium, barium, copper, lanthanum, niobium, strontium, lead, aluminum and mixtures thereof.

3. A system for forming multiple-component thin films on a substrate comprising:
   a plurality of ion-cluster beam (ICB) sources, each ICB source having an isolated, heated crucible having a beam exit nozzle and a source controller for regulating the quantity of the component leaving the crucible;
   means for accelerating an ion-cluster beam out of the crucible through the exit nozzle with an accelerating voltage;
   an extraction current monitor on the ion-cluster beam acceleration means for measuring the extraction current of the beam and obtaining a real time signal for stoichiometry control; and
   means for feeding back the real time signal to the source controller to increase or decrease the supply of the component to the crucible, the component being distributed by the beam within a predetermined stoichiometric proportion;
   a microwave energy cavity in position after the ion-cluster acceleration means for breaking down the ion-cluster beam into an atomic ion beam;
   an oxygenating cavity in position after the microwave energy cavity for incorporating oxygen the atomic component beam; and
   a reaction chamber bearing the substrate, where each of the ion-cluster beams produced by the respective ICB source is directed at the substrate and admission of the beams into the chamber is independently controlled by shutters.

4. The system of claim 3 wherein the multiple-component thin film being produced is a superconducting thin film and a separate ICB source is present for at least two of the components selected from the group consisting of yttrium, barium, copper, lanthanum, niobium, strontium, lead, aluminum and mixtures thereof.

* * * * *